United States Patent
Tomita (10) Patent No.: US 6,559,676 B1
(45) Date of Patent: May 6, 2003

(54) OUTPUT BUFFER CIRCUIT

(75) Inventor: Takashi Tomita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/996,754

(22) Filed: Nov. 30, 2001

(51) Int. Cl.[7] .............................. H03K 3/00; H03B 1/00
(52) U.S. Cl. .............................. 326/81; 326/83; 326/26; 326/27; 326/87; 327/108; 327/170; 327/312
(58) Field of Search .............................. 326/22, 23, 26, 326/27, 81, 83; 327/108–112, 170, 312

(56) References Cited

U.S. PATENT DOCUMENTS

| | | | | |
|---|---|---|---|---|
| 5,010,256 A | * | 4/1991 | Dicke | 327/310 |
| 5,120,992 A | | 6/1992 | Miller et al. | |
| 5,699,000 A | * | 12/1997 | Ishikuri | 327/108 |
| 6,051,995 A | * | 4/2000 | Pollachek | 326/87 |
| 6,236,248 B1 | * | 5/2001 | Koga | 327/112 |

FOREIGN PATENT DOCUMENTS

| JP | 5-218847 | 8/1993 |
|---|---|---|
| JP | 9-148909 | 6/1997 |
| JP | 10-290154 | 10/1998 |

* cited by examiner

*Primary Examiner*—Michael Tokar
*Assistant Examiner*—Vibol Tan
(74) *Attorney, Agent, or Firm*—Volentine Francos, PLLC (57) ABSTRACT

An output buffer circuit includes first and second MOS transistors connected in series between a power supply and ground, a first pull up transistor coupled between the power supply and a gate of the first MOS transistor, a first pull down transistor coupled between ground and the gate of the first MOS transistor, a second pull up transistor coupled between the power supply and the gate of the second MOS transistor, a second pull down transistor coupled between ground and the gate of the second MOS transistor, a slew-rate control node, a third MOS transistor coupled between the power supply and the slew-rate control node, a fourth MOS transistor coupled between ground and the slew-rate control node, a first variable resistance provided between the first pull up and pull down transistors, and a second variable resistance provided between the second pull up and pull down transistors.

21 Claims, 9 Drawing Sheets

OUTPUT BUFFER CIRCUIT

BACKGROUND OF THE INVENTION

1. Field of the Invention

The present invention relates to an output buffer circuit, especially relates to an output buffer circuit embedded in a semiconductor integrated circuit.

2. Description of the Related Art

The semiconductor integrated circuit called as SOG (Sea Of Gate) type has many input buffer circuits and output buffer circuits. The output buffer circuit is connected to an output terminal and drives an external load connected to the output terminal to H level or L level. When a plurality of output buffer circuits drive the external loads to H level or L level simultaneously, current which flows to the semiconductor integrated circuit changes sharply. Noise occurred by rapid change of the current flow may affect other circuits, such as the input buffer circuit. For example, the input buffer circuit in the semiconductor integrated circuit may cause incorrect operation.

As conventional technology for solving such a problem, an output buffer circuit that has a threw-rate control function is known. The threw-rate means the change speed of an output voltage output from the output buffer circuit. In such a conventional output buffer circuit, since the threw-rate is controlled, rapid change of the current flow explained above is controlled and thus occurrence of the noise is reduced.

One technology for controlling the threw-rate is that a dimension of a MOS transistor comprised of a pre-driver, which drives a MOS transistor comprised of a main driver, is set small. However, in this approach, since the drive capability of the MOS transistor becomes small, although it is effective in reduction of a noise, the propagation delay time of the output buffer circuit may become long.

Another technology for controlling the threw-rate is providing a resistance means in the pre-driver. An output buffer circuit which has the pre-driver to which the resistance means is added is described in FIG. 1 and FIG. 4 of U.S. Pat. No. 5,120,992. However, since this approach only adds the resistance means, although it is effective in reduction of the noise, the propagation delay time of the output buffer circuit may become long.

An output buffer circuit that has a PMOS transistor and an NMOS transistor which are connected in parallel (called as a transmission gate) and used as the above-mentioned resistance means is described FIG. 1 and FIG. 4 of Japanese Laid Open Patent No. 5-218847. However, since a gate electrode of the PMOS transistor and a gate electrode of the NMOS transistor are connected to a ground potential and a power supply potential, respectively, the threw-rate is determined only by the ON resistance of the PMOS transistor and the NMOS transistor. That is, this approach means that flexibility is small in control of the threw-rate.

An output buffer circuit having a control circuit for controlling the conductive states of the PMOS transistor and the NMOS transistor connected in parallel and mentioned above is described in FIG. 1 of Japanese Laid Open Patent No.10-290154.

In this approach, a rising transition time period where the output voltage of the output buffer circuit rises from L level to H level can be decreased by setting up the ON resistance of the PMOS transistor lower than the ON resistance of the NMOS transistor. However, a falling transition time period where the output voltage falls from H level to L level in this case increases conversely. On the other hand, the falling time period can be decreased by setting up the ON resistance of the NMOS transistor smaller than the ON resistance of the PMOS transistor. However, the rising time period in this case increases conversely. That is, it is difficult to improve more the propagation delay time of the whole output buffer circuit in this approach.

As mentioned above, the problem of a noise and the problem of propagation delay time are in the relation of a trade-off. Therefore, the output buffer circuit that overcomes two problems in the relation of the trade-off has been demanded.

SUMMARY OF THE INVENTION

It is an object of the present invention is to provide an output buffer circuit for overcoming two problems in the relation of an above-mentioned trade-off.

In detail, it is an object of the present invention is to provide an output buffer circuit that can reduce a propagation delay time and can reduce a noise. It is another object of the present invention is to provide an output buffer circuit that has good slew-rate controllability.

According to one aspect of the present invention, for achieving one or more of the above objects, there is provided an output buffer circuit which includes a power supply node supplied with a power supply potential level, a ground node supplied with a ground potential level, and a data output node which outputs data. The output buffer circuit also includes a first transistor of a first conductive type, which is coupled between the power supply node and the data output node and which has a control electrode, a second transistor of a second conductive type, which is coupled between the ground node and the data output node and which has a control electrode, and a data input node which receives data. The output buffer further includes a first pull up transistor of the first conductive type, which is provided at a first current path between the power supply node and the control electrode of the first transistor and which charges the control electrode of the first transistor to the power supply potential level in response to data at the data input node, a first pull down transistor of the second conductive type, which is provided at a second current path between the ground node and the control electrode of the first transistor and which discharges the control electrode of the first transistor to the ground potential level in response to data at the data input node, a second pull up transistor of the first conductive type, which is provided at a third current path between the power supply node and the control electrode of the second transistor and which charges the control electrode of the second transistor to the power supply potential level in response to data at the data input node, and a second pull down transistor of the second conductive type, which is provided at a fourth current path between the ground node and the control electrode of the first transistor and which discharges the control electrode of the first transistor to the ground potential level in response to data at the data input node. The output buffer circuit also includes a slew-rate control node, a third transistor of the first conductive type, which is coupled between the power supply node and the slewrate control node and which has a control electrode connected to the control electrode of the first transistor, a fourth transistor of the second conductive type, which is coupled between the ground node and the slew-rate control node and which has a control electrode connected to the control electrode of the second transistor, a first variable resistance circuit which is provided at the second current path and which has a resistance value, the resistance value is changed in response to a potential of the slew-rate control node, and a second variable resistance circuit which is provided at the third current path and which has a resistance value, the resistance value is changed in response to a potential of the slew-rate control node.

The above and further objects and novel features of the invention will more fully appear from the following detailed description, appended claims and the accompanying drawings.

DETAILED DESCRIPTION OF THE PREFERRED EMBODIMENTS

An output buffer circuit according to preferred embodiments of the present invention will be explained hereinafter with reference to figures. In order to simplify explanation, like elements are given like or corresponding reference numerals through this specification and figures. Dual explanations of the same elements are avoided.

First Preferred Embodiment

Figure 1:
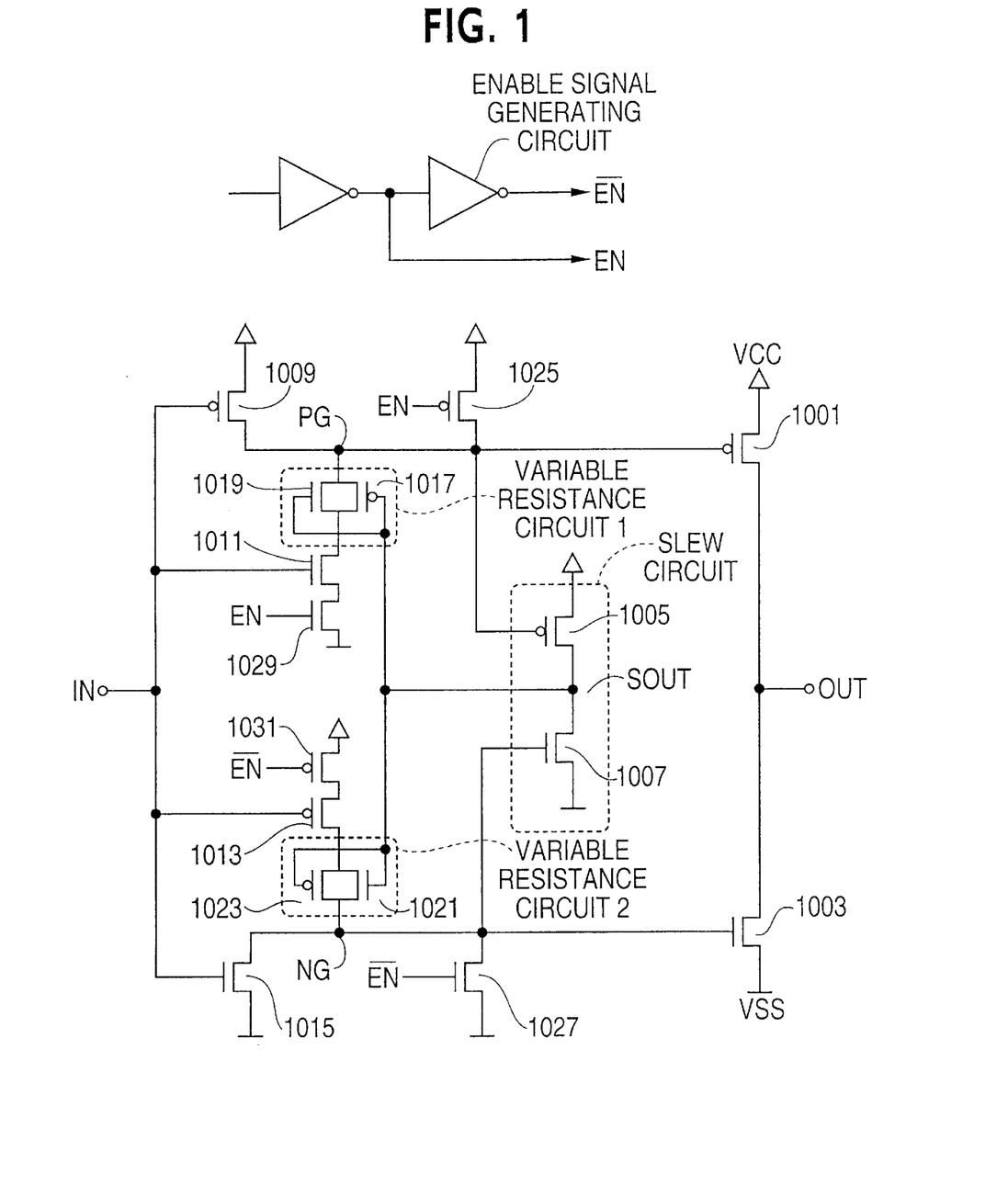
FIG. 1 is a circuit diagram showing an output buffer circuit according to a first preferred embodiment of the present invention.

FIG. 1 is a circuit diagram showing an output buffer circuit according to a first preferred embodiment of the present invention.

The output buffer circuit of the present invention includes a main driver, two pre-drives, a slew-rate control circuit SC and variable resistance circuits VR1 and VR2.

The main driver comprised of a P channel type MOS transistor (it is called PMOS hereinafter.) 1001 and an N channel type MOS transistor (it is called NMOS hereinafter.) 1003.

PMOS 1001 has a source connected to a power supply node VCC to which a power supply potential level is supplied, a drain connected to a data output node OUT and a gate connected to a node PG. NMOS 1003 has a source connected to a ground node VSS to which a ground potential level is supplied, a drain connected to the data output node OUT and a gate connected to a node NG. The power supply potential level is 3.3V, and the ground potential level is 0V.

A potential level according to data applied to a data input node IN appears at the data output node OUT. For example, when the data input node IN receives data having L level (for example, 0V.), the data output node OUT outputs data having L level. On the other hand, when the data input node IN receives data having H level (for example, 3.3V), the data output node OUT outputs data having H level.

The first pre-driver comprised of a PMOS 1009 and an NMOS 1011, and functions as a first CMOS inverter. In detail, the PMQS 1009 functions as a pull-up transistor which carries out the pull-up of the node PG, and the NMOS 1011 functions as a pull down transistor which carries out the pull down of the node PG.

The PMOS 1009 has a source connected to the power supply node VCC, a drain connected to the node PG, and a gate connected to the data input node IN. A path between the power supply nodes VCC and node PG in which the PMOS 1009 is formed is defined as a first current path.

The NMOS 1011 has a source connected to the ground node VSS through an NMOS 1029, a drain connected to the node PG through the variable resistance circuit VR1, and a gate connected to the data input node IN. A path between the ground node VSS and the node PG in which the NMOS 1011 is formed is defined as second current path.

The NMOS1029 is connected between the source of the NMOS 1011 and the ground node VSS. The NMOS 1029 has a source connected to the ground node VSS, a drain connected to the source of the NMOS 1011, and a gate which receives an enable signal EN. The NMOS 1029 enters into the ON state in response to the enable signal EN having H level, and changes the first CMOS inverter into an enable state.

The variable resistance circuit VR1 is connected between the node PG and the drain of the NMOS 1011, and comprised of a PMOS 1017 and an NMOS 1019 which are connected in parallel.

The PMOS 1017 has a source connected to the node PG, a drain connected to the drain of the NMOS 1011, and a gate connected to a slew-rate control node SOUT. The NMOS 1019 has a drain connected to the node PG, and a source connected to the drain of the PMOS 1017, and a gate connected to the slew-rate control node SOUT. The ON resistance of the PMOS 1017 is set up smaller than the ON resistance of the NMOS 1019.

The NMOS 1011 and the NMOS 1029 are provided in the second current path between the node PG and the ground node VSS with the variable resistance circuit VR1.

The second pre-driver comprised of a PMOS 1013 and an NMOS 1015, and functions as a second CMOS inverter. In detail, the PMOS 1013 functions as a pull up transistor which carries out the pull up of the node NG, and the NMOS 1015 functions as a pull down transistor which carries out the pull down of the node NG.

The PMOS 1013 has a source connected to the power supply node VCC through the PMOS 1031, a drain connected to the node NG through the variable resistance circuit VR2, and a gate connected to the data input node IN. A path between the power supply nodes VCC and the node NG in which the PMOS 1013 is provided is defined as a third current path.

The NMOS 1015 has a source connected to the ground node VSS, a drain connected to the node NG, and a gate connected to the data input node IN. A path between the ground nodes VSS and the node NG in which the NMOS 1015 is provided is defined as fourth current path.

APMOS 1031 is connected between the source of the PMOS 1013 and the power supply node VCC. The PMOS 1031 has a source connected to the power supply node VCC, and a drain connected to the source of the PMOS 1013, and a gate which receives an enable signal/EN. The PMOS 1031 enters into the ON state in response to the enable signal/EN having L level, and changes the second CMOS inverter into an enable state.

The variable resistance circuit VR2 is connected between node NG and the drain of the PMOS 1013, and comprised of a PMOS 1023 and an NMOS 1021 connected in parallel.

The PMOS 1023 has a drain connected to the node NG, a source connected to the drain of the PMOS 1013, and a gate connected to slew-rate control node SOUT. The NMOS 1021 has a source connected to the node NG, a drain connected to the drain of the PMOS 1013, and a gate connected to slew-rate control node SOUT. The ON resistance of the NMOS 1021 is set up smaller than the ON resistance of the PMOS 1023.

The PMOS 1031 and the PMOS 1013 are provided in the third current path between the node NG and the power supply node VCC with the variable resistance curcuit VR2.

The slew-rate control circuit SC comprised of a PMOS 1005 and an NMOS 1007 which are connected in series between the power supply node VCC and the ground node VSS.

The PMOS 1005 has a source connected to the power supply node VCC, a drain connected to slew-rate control node SOUT, and a gate connected to the node PG. The NMOS 1007 has a source connected to the ground node VSS, a drain connected to slew-rate control node SOUT, and a gate connected to the node NG.

A threshold voltage Vtp 1005 of the PMOS 1005 is set as value almost equal to a threshold voltage Vtp1001 of the PMOS 1001. A threshold voltage Vtn1007 of the NMOS 1007 is set as value almost equal to a threshold voltage Vtn1003 of the NMOS 1003.

The output buffer circuit of the present invention further has a PMOS 1025 and an NMOS 1027.

The PMOS1025 has a source connected to the power supply node VCC, a drain connected to the node PG, and a gate which receives the enable signal EN. The PMOS 1025 enters into the ON state in response to the enable signal EN having L level, and pulls up of the node PG to H level.

The NMOS 1027 has a source connected to the ground node VSS, a drain connected to the node NG, and a gate which receives the enable signal/EN. The NMOS 1027 enters into the ON state in response to the enable signal/EN having H level, and pulls down of the node NG to L level.

The enable signal EN and the enable signal/EN are output from an enable signal generating circuit ENG. Since the PG and the node NG are set to H level and L level, respectively when the enable signal EN is L level node (the enable signal/EN is H level at this time), both PMOS 1001 and the NMOS 1003 enter into OFF states. Moreover, both of the first and second CMOS inverters enter into disable states. Therefore, the data output node OUT enters into a high impedance state.

Next, an operation of the output buffer circuit of the present invention is explained below with reference to figures.

Figure 2:
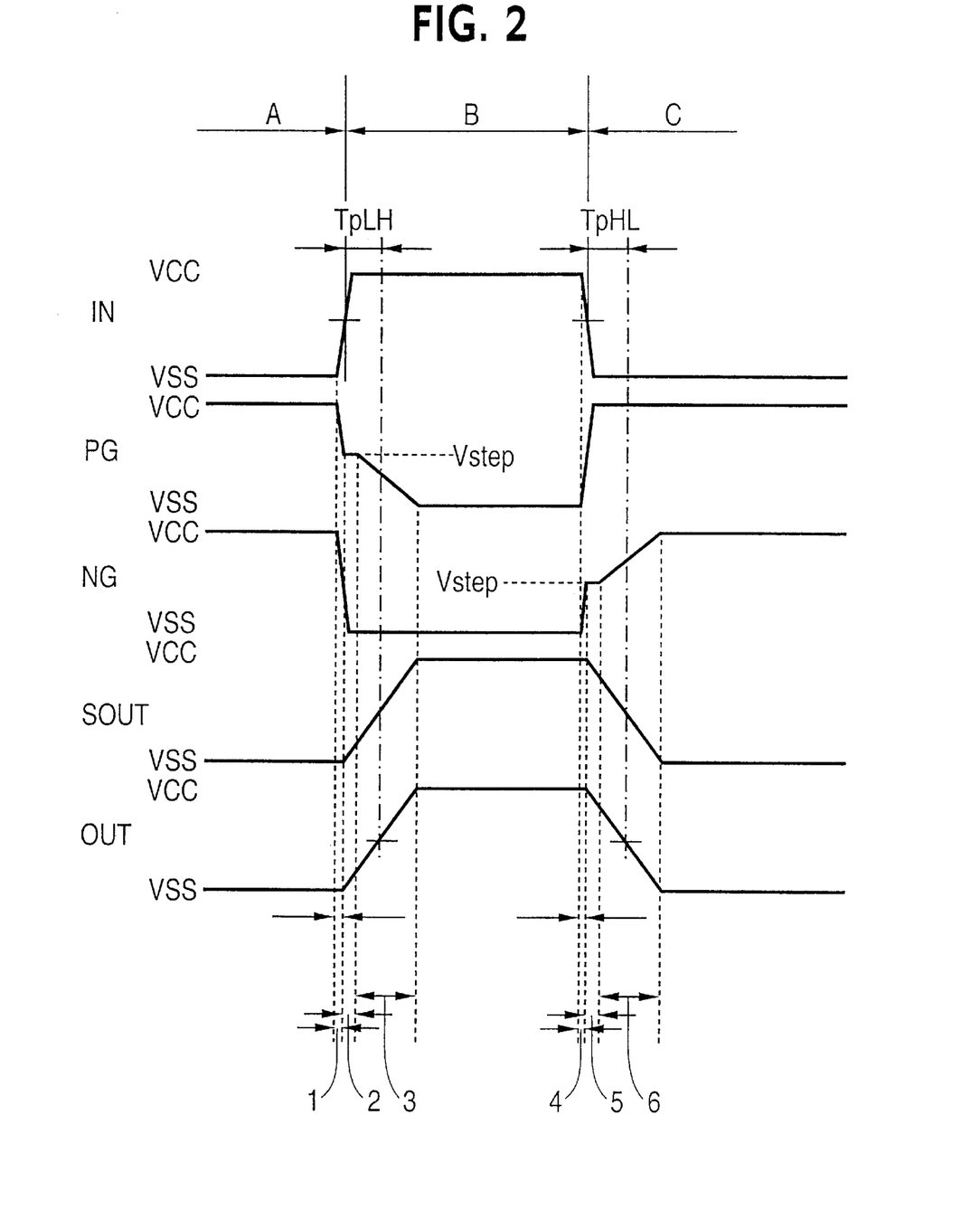
FIG. 2 is a timing chart showing an operation of the output buffer circuit shown in FIG. 1.

FIG. 2 is a timing chart showing an operation of the output buffer circuit shown in FIG. 1.

(High Impedance State)

When the enable signal EN having L level is output from the enable signal generating circuit ENG, the PMOS 1025 and the NMOS 1027 enter into the ON state, and the PMOS 1031 and the NMOS 1029 enter into the OFF state. Since the PMOS 1031 and the NMOS 1029 enter into the OFF state, the first and the second CMOS inverters enter into the disable state, and thus the potential of the data input node IN is not transferred to the node PG and the node NG. Furthermore, since the PMOS 1025 and the NMOS 1027 enter into the ON state, the pull up of the node PG to H level is carried out, and the pull down of node NG to L level is carried out. Thereby, the PMOS 1001 and the NMOS 1003 are in the OFF state. Consequently, the data output node OUT is set into the high impedance state. This state is not shown in FIG. 2.

(Time Period A)

After the high impedance state, when the enable signal EN having H level is output from the enable signal generating circuit ENG, the PMOS 1025 and the NMOS 1027 enter into the OFF state, and the PMOS 1031 and the NMOS1029 enter into the ON state. Since the PMOS 1025 and the NMOS 1027 enter into the OFF state, pull up operation by the PMOS 1025 is stopped, and pull down operation by the NMOS 1027 is stopped. Moreover, since the PMOS 1031 and the NMOS 1029 enter into the ON state, the first and the second CMOS inverters enter into the enable states.

In the time period A, since data having L level is applied to the data input node IN, the node PG is H level and the node NG is H level. Since the node PG and the node NG are H levels, the PMOS 1001 is in the OFF state and the NMOS 1003 is in the ON state. Consequently, the data output node OUT is L level. Moreover, since the node PG and the node NG are H levels, the PMOS 1005 of the slew-rate control circuit SC is in the OFF state, and the NMOS 1007 of the slew-rate control circuit SC is in the ON state. Since the NMOS 1007 is in the ON state, slew-rate control node SOUT is in the L level.

(Time Period B)

Figure 3:
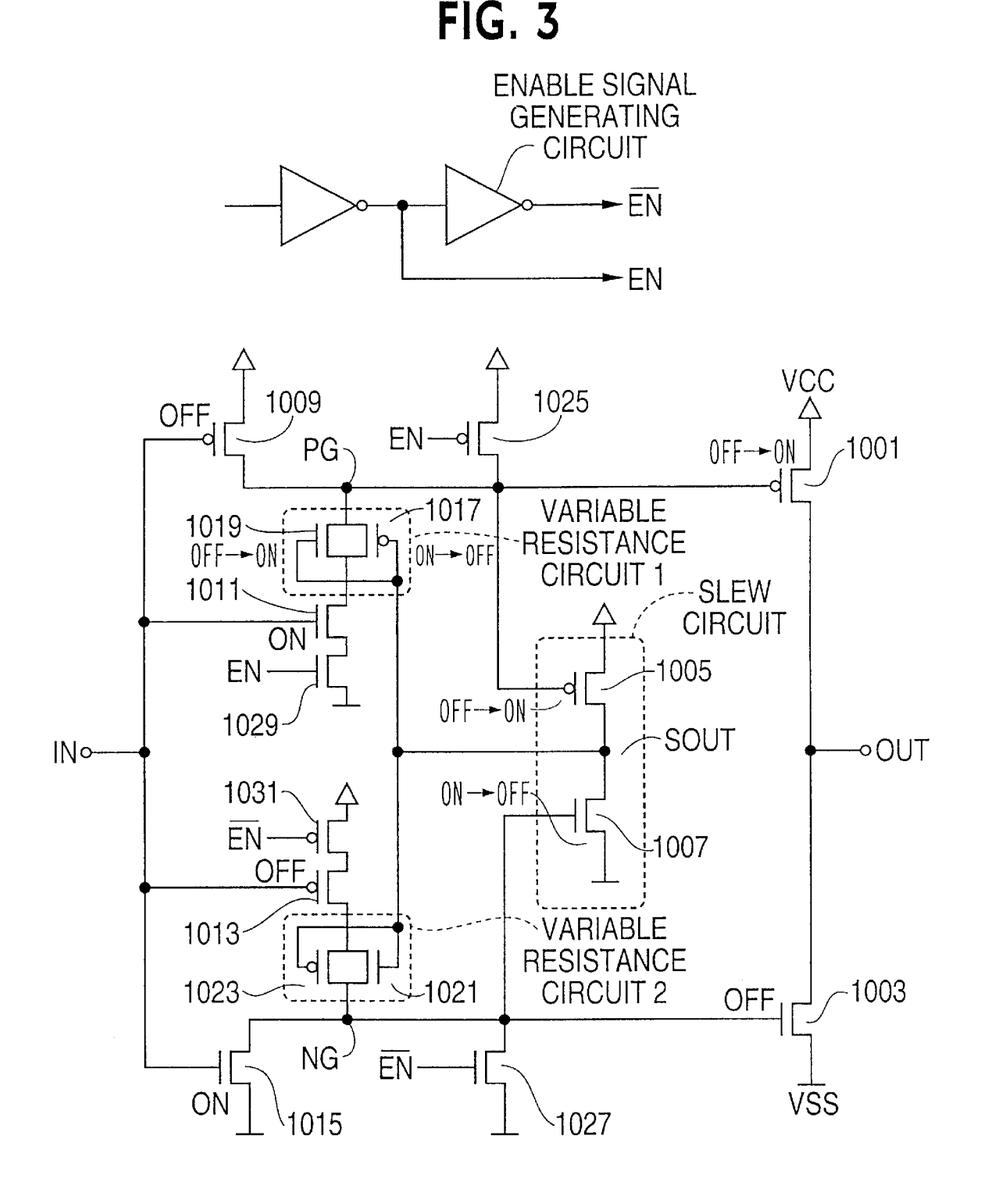
FIG. 3 is a chart showing conductive states of main transistors at time periods ① through ② in a time period B.

FIG. 3 is a chart showing conductive states. of main transistors at time periods ① through ③ in a time period B. In order to make understanding easy, this figure should be referred.

After time period A, when data having H level is applied to the data input node IN, the PMOS 1013 enters into the OFF state and the NMOS 1015 enters into the ON state. Since the node NG is electrically connected to the ground node VSS by the NMOS 1015, the node NG falls from H level to L level quickly. Thereby, the NMOS 1003 and the NMOS 1007 change into the OFF states quickly.

On the other hand, when the data having H level is applied to the data input node IN, since the PMOS 1009 enters into the OFF state and the NMOS 1011 enters into the ON state, the pull down operation of the node PG by the NMOS1011 is started. Now, since the potential of the slew-rate control node SOUT is in the L level, the PMOS 1017 is in the ON state and the NMOS 1019 is in the OFF state. Therefore, the potential of the node PG is electrically connected to the ground node VSS through the PMOS 1017 with low ON resistance. Since the ON resistance of the PMOS 1017 is lower than the ON resistance of the NMOS 1019, the potential of the node PG falls toward the L level direction quickly. Since the potential of the node PG falls quickly, the voltage Vgs1001 between the source and the drain of the PMOS 1001 exceeds quickly the threshold voltage Vtp1001 of the PMOS 1001. Therefore, the PMOS 1001 changes into the ON state quickly. Consequently, the potential level of the data output node OUT begins to rise. (time period ①)

When the potential of the node PG falls and the voltage Vgs1005 between the source and the drain of the PMOS 1005 exceeds the threshold voltage Vtp1005 of the PMOS 1005, the PMOS1005 changes into the ON state. Consequently, the potential of the slew-rate control node SOUT rises gradually. Since the threshold voltage Vtp1005 of the PMOS 1005 is set up equally to the threshold voltage Vtp1001 of the PMOS 1001, the rising point of the potential at the slew-rate control node SOUT almost corresponds to the rising point of the potential at the data output node OUT.

If the potential difference between the node PG and the slew-rate control node SOUT becomes smaller than the threshold voltage Vtp1017 of the PMOS 1017, the PMOS 1017 changes into the OFF state. The potential level at this time is indicated as Vstep in FIG. 2. The value of the potential Vstep depends on the falling speed of the potential at node PG and the rising point of the potential at the slew-rate control node SOUT. That is, the value of the Vstep is determined by the ON resistance of the PMOS 1017 and the ON resistance of the PMOS 1005. Therefore, the potential of the Vstep can be set as desired value by adjusting the ON resistance of the PMOS 1017 and the PMOS 1005. For example, when a resistance means is inserted between the source of the PMOS 1005 and the power supply node VCC, the rising speed of the potential of the slew-rate control node SOUT becomes slow. Therefore, it is possible to reduce the potential of the Vstep, because a time to change for PMOS 1017 into the OFF state is overdue.

Conversely, when the potential of the Vstep is set at relatively high, the ON resistance of the PMOS 1005 is set at low by adjusting its dimension W/L (W is the gate width of a transistor and L is the gate length of a transistor) become large.

For a while after the potential of the node PG reaches Vstep, the NMOS 1019 and the PMOS 1017 maintain the OFF state. Or the NMOS 1019 maintains a very weak ON state. Therefore, the potential level of the node PG is maintained in this time period. (time period ②)

When the potential of the slew-rate control node SOUT rises more, the NMOS 1019 enters into the ON state. Therefore, the node PG is electrically connected to the ground node VSS through the NMOS 1019 with the high ON resistance. Since the ON resistance of the NMOS 1019 is higher than the ON resistance of the PMOS 1017, the potential of the node PG falls toward the L level direction slowly. Consequently, the peak value of current which flows firom the power supply node VCC to the data output node OUT through the PMOS 1001 can be made small. The potential level of the node PG finally reaches to L level. The potential of the data output node OUT and slew-rate control node SOUT finally reaches to H level. (time period ③)

As explained above, it is the feature that the present invention has the first time period when the potential of the node PG changes sharply, the second time period which follows the first time period when the potential of the node PG is maintained, and the third time period which follows the second time period when the potential of the node PG changes slowly. According to the present invention, it is possible to reduce peak current value without lengthening TpLH. Therefore, it is possible to reduce a noise, maintaining high-speed operation (without lengthening TpLH). The "TpLH" is defined as follows. That is, it is a time period after the potential level of the data input node IN changes from L level to H level until the potential level of the data output node OUT changes from L level to H level.
(Time Period C)

Figure 4:
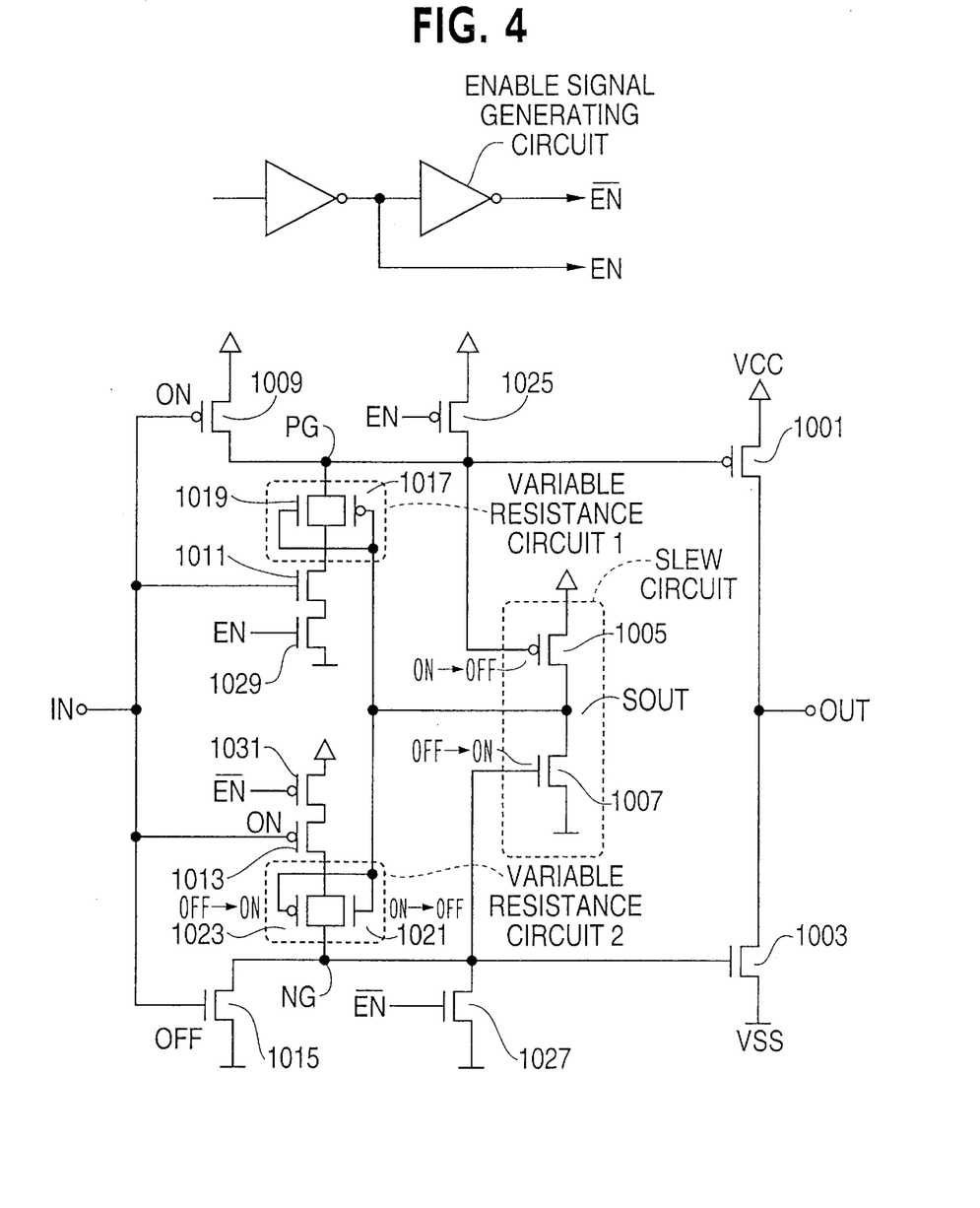
FIG. 4 is a chart showing conductive states of main transistors at time periods ④ through ⑥ in a time period C.

FIG. 4 is a chart showing conductive states of main transistors at time periods ④ through ⑥ in a time period C. In order to make understanding easy, this figure should be referred.

After time period B, when data having L level is applied to the data input node IN, the PMOS 1009 enters into the ON state and the NMOS 1011 enters into the OFF state. Since the node PG is electrically connected to the power supply node VCC by the PMOS 1009, the node PG rises to H level from L level sharply. Thereby, the PMOS 1001 and the PMOS 1005 change into the OFF state quickly. On the other hand, when the data having L level is applied to the data input node IN, since the PMOS 1013 enters into the ON state and the NMOS 1015 enters into the OFF state, pull up operation of the node NG by the PMOS 1013 is started. Now, since the potential of the slew-rate control node SOUT is in the H level, the PMOS 1023 is in the OFF state and the NMOS 1021 is in the ON state. Therefore, the potential of the node NG is electrically connected to the power supply node VCC through the NMOS 1021 with small ON resistance. Since the ON resistance of the NMOS 1021 is smaller than the ON resistance of the PMOS 1023, the potential of the node NG rises toward the H level direction quickly. Since the potential of the node NG rises quickly, the voltage Vgs1003 between the source and the drain of the NMOS 1003 exceeds quickly the threshold voltage Vtn1003 of the NMOS 1003. Therefore, the NMOS 1003 changes into the ON state quickly. Consequently, the potential level of the data output node OUT begins to fall.(time period ④)

When the potential of the node NG rises and the voltage Vgs1007 between the source and the drain of the NMOS 1007 exceeds the threshold voltage Vtn1007 of the PMOS 1007, the NMOS1007 changes into the ON state. Consequently, the potential of slew-rate control node SOUT falls gradually. Since the threshold voltage Vtn1007 of the NMOS 1007 is set up equally to the threshold voltage Vtn1003 of the NMOS1003, the falling point of the potential at slew-rate control node SOUT is almost corresponds to the falling point of the potential at the data output node OUT.

If the potential difference between the node NG and the slew-rate control node SOUT becomes smaller than the threshold voltage Vtn1021 of the NMOS 1021, the NMOS 1021 change into the OFF state. The potential level at this time is indicated as Vstep in FIG. 2. The value of the potential Vstep depends on the rising speed of the potential of the node NG, and the falling speed of the potential of the slew-rate control node SOUT. That is, the value of the Vstep is determined by the ON resistance of the NMOS 1021, and the ON resistance of the NMOS 1007. Therefore, the potential of the Vstep can be set as desired value by adjusting the ON resistance of the NMOS 1021 and the NMOS 1007. For example, when a resistance means is inserted between the source of the NMOS 1007 and the ground node VSS, the falling speed of the potential at the slew-rate control node SOUT becomes slow. Therefore, it is possible to increase the potential of the Vstep, because a time to change for the NMOS 1021 into the OFF state is delayed. Conversely, when the potential of the Vstep is set at relatively high, the ON resistance of the NMOS 1007 is set at low by adjusting its dimension W/L (W is the gate width of a transistor and L is the gate length of a transistor) become large.

For a while after the potential of the node NG reaches Vstep, the NMOS 1021 and the PMOS 1023 maintain the OFF state. Or the PMOS 1023 maintains a very weak ON state. Therefore, the potential level of node NG is maintained in this time period. (time period ⑤)

When the potential at the slew-rate control node SOUT falls further, the PMOS 1023 changes into the ON state. Therefore, the node NG is electrically connected to the power supply node VCC through the PMOS 1023 with large ON resistance. Since the ON resistance of the PMOS 1023 is higher than the ON resistance of the NMOS1021, the potential of the node NG rises toward the H level direction slowly. Consequently, the peak value of current which flows from the data output node OUT to the ground node VSS through the NMOS 1003 can be made small. The potential level of the node NG finally reaches to H level. The potential at the data output node OUT and the slew-rate control node SOUT finally reaches L level. (time period ⑥)

As explained above, it is the feature that the present invention has the fourth time period when the potential of the node NG changes sharply, the fifth time period which follows the fourth time period when the potential of the node NG is maintained, and the sixth time period which follows the fifth time period when the potential of the node NG changes slowly. According to the present invention, it is possible to reduce peak current value without lengthening TpHL. Therefore, it is possible to reduce a noise, maintaining high-speed operation (without lengthening TpHL). The "TpHL" is defined as a time period after the potential level at the data input node IN changes from H level to L level until the potential level at the data output node OUT changes from H level to L level.

Figure 5:
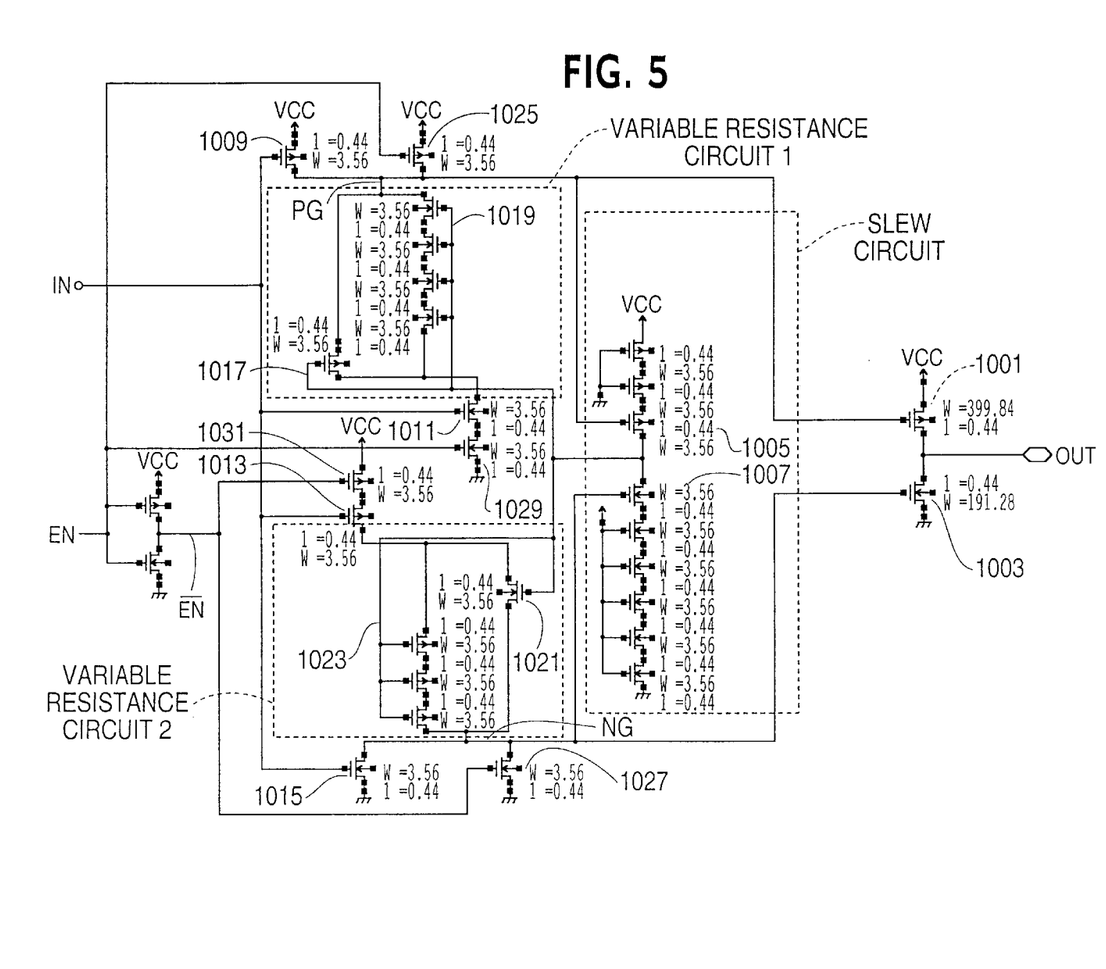
FIG. 5 is a detailed circuit diagram of the output buffer circuit to which the present invention is applied.

FIG. 5 is a detailed circuit diagram of the output buffer circuit to which the present invention is applied.

The PMOS 1001 of the main driver has a gate length of 0.44 microns, and a gate width of 399.84 microns. The NMOS 1003 of the main driver has the gate length of 0.44 microns, and the gate width of 191.28 microns.

The PMOS 1009 of the first CMOS inverter has the gate length of 0.44 microns, and the gate width of 3.56 microns. The NMOS 1011 of the first CMOS inverter has the gate length of 0.44 microns, and the gate width of 3.56 microns.

The PMOS 1013 of the second CMOS inverter has the gate length of 0.44 microns, and the gate width of 3.56 microns. The NMOS 1015 of the second CMOS inverter has the gate length of 0.44 microns, and the gate width of 3.56 microns.

The PMOS 1017 of the variable resistance circuit VR1 has the gate length of 0.44 microns, and the gate width of 3.56 microns. The NMOS 1019 of the variable resistance circuit VR1 comprised of four unit NMOSs which are connected in series. One NMOS has the gate length of 0.44 microns, and the gate width of 3.56 microns.

The NMOS 1021 of the variable resistance circuit VR2 has the gate length of 0.44 microns, and the gate width of 3.56 microns. The PMOS1023 of the variable resistance circuit VR2 comprised of three unit PMOSs which are connected in series. One PMOS has the gate length of 0.44 microns, and the gate width of 3.56 microns.

The PMOS1005 of the slew-rate control circuit SC has the gate length of 0.44 microns, and the gate width of 3.56 microns. Two unit PMOSs are connected between the source of the PMOS 1005 and the power supply node VCC in series. The PMOSs are explained previously as a resistance means. Each PMOS has the gate length of 0.44 microns, and the gate width of 3.56 microns. The gate of each PMOS is connected with the ground node VSS and thus each PMOS is always in the ON state.

The NMOS 1007 of the slew-rate control circuit SC has the gate length of 0.44 microns, and the gate width of 3.56 microns. Five unit NMOSs are connected between the source of the NMOS 1007 and the ground node VSS in series. The NMOSs are explained previously as a resistance means. Each NMOS has the gate length of 0.44 microns, and the gate width of 3.56 microns. The gate of each NMOS is connected with the power supply node VCC and thus each NMOS is always in the ON state.

Furthermore, the PMOS 1025, the PMOS 1031, the NMOS 1027, and the NMOS1015 have the gate length of 0.44 microns, and the gate width of 3.56 microns, respectively.

As shown in FIG. 5, circuits other than the main driver are comprised of the unit cell (unit MOS transistor) which has a predetermined gate length and a predetermined gate width.

It is suitable that the output buffer circuit of the present invention which has the portions (the variable resistance circuit, the slew-rate control circuit SC, and the resistance means connected to the slew-rate control circuit SC) should adjust resistance thereof is realized by the SOG type semiconductor integrated circuit having such a unit cell.

Because any special elements and special region for forming a resistance means are unnecessary since the SOG type semiconductor integrated circuit has two or more unit cells which are formed beforehand. Moreover, because the special process for obtaining desired ON resistance is unnecessary since two or more unit cells are formed beforehand.

FIG. 6A through FIG. 6E are timing charts showing a simulation result of the output buffer circuit shown in FIG. 5. The conditions of the simulation are as follows. The capacitor of 50 pf is connected to the data output node OUT as load. The 20 MHz data signal which has the amplitude of 3.3V is supplied to the data input node IN.

Figure 6A:
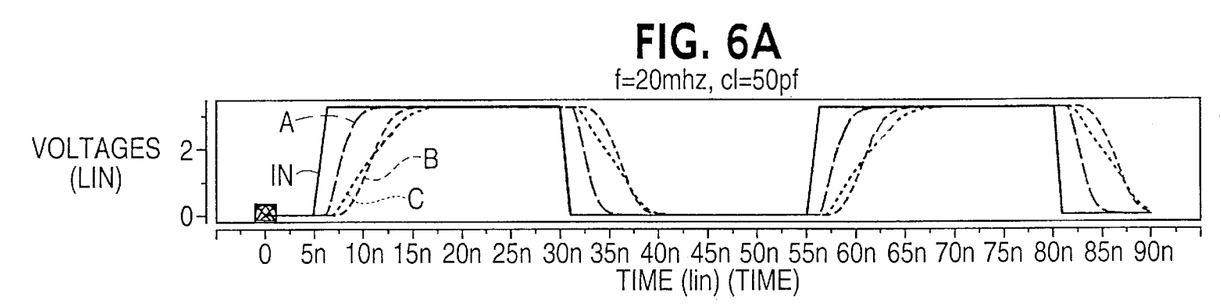
FIG. 6A is a timing chart showing voltage change at a data input node IN, and voltage change at a data output node OUT.
Figure 6B:
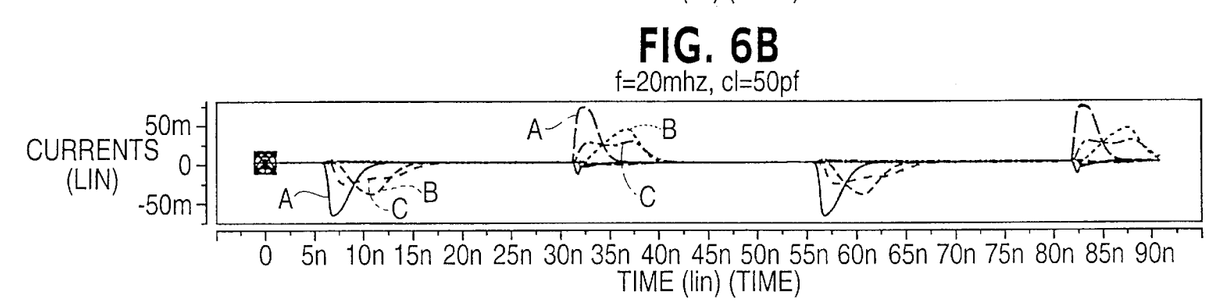
FIG. 6B is a timing chart showing change of current which flows through an output buffer circuit.

FIG. 6A is a timing chart showing voltage change at a data input node IN, and voltage change at a data output node OUT. FIG. 6B is a timing chart showing change of current which flows through an output buffer circuit.

In FIG. 6A and FIG. 6B, "A" shows a waveform of the output buffer circuit of the first conventional technology in which the slew-rate control circuit is not included. In FIG. 6A, "B" shows a wave form of the output buffer circuit of the second conventional technology having a slew-rate control circuit which includes a fixed resistance means. In FIG. 6A, "C" shows a waveform of the output buffer circuit of the present invention shown in FIG. 5.

Figure 6C:
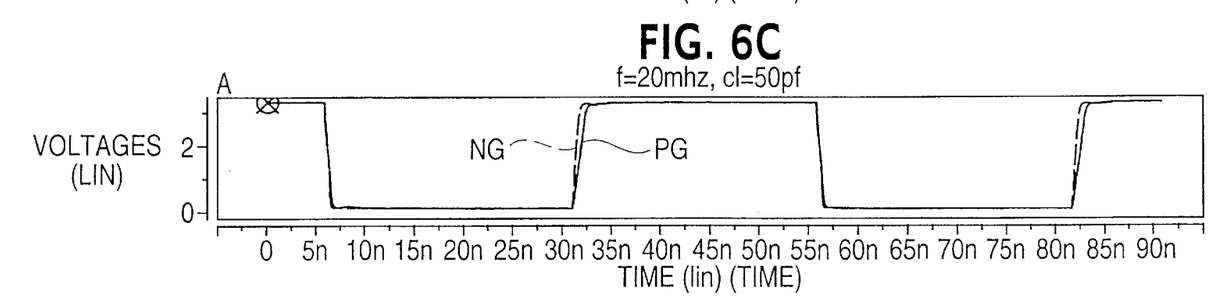
FIG. 6C is a timing chart showing potential change at a node NG and a node PG in the output buffer circuit of the first conventional technology.

FIG. 6C is a timing chart showing potential change at a node NG and a node PG in the output buffer circuit of the first conventional technology.

Figure 6D:
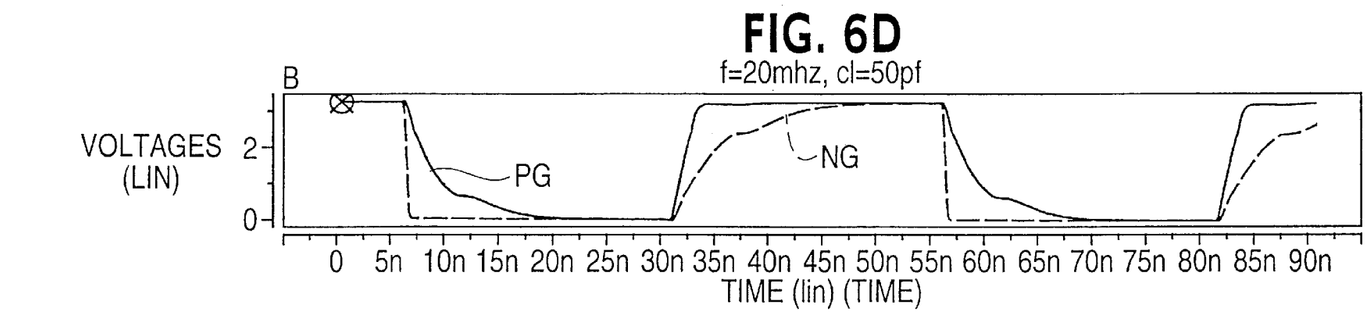
FIG. 6D is a timing chart showing potential change at a node NG and a node PG in the output buffer circuit of the second conventional technology.

FIG. 6D is a timing chart showing potential change at a node NG and a node PG in the output buffer circuit of the second conventional technology.

Figure 6E:
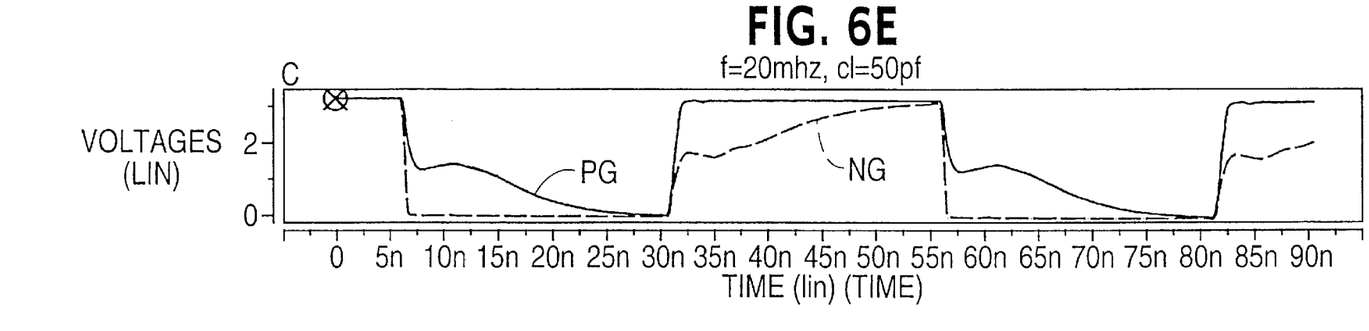
FIG. 6E is a timing chart showing potential change at a node NG and a node PG shown in the output buffer circuit of the present invention.

FIG. 6E is a timing chart showing potential change at a node NG and a node PG shown in the output buffer circuit of the present invention.

Although the output buffer circuit of the first conventional technology of TpLH and TpHL are shorter than the output buffer circuit of the present invention as shown in FIG. 6A, the peak value of current which flows the output buffer circuit is larger than the output buffer circuit of the present invention as shown in FIG. 6B. Therefore, the noise reduction effect is lower than the output buffer circuit of the present invention.

The output buffer circuit of the second conventional technology of TpLH and TpHL are longer than the output buffer circuit of the present invention as shown in FIG. 6A. Furthermore, the peak value of current which flows the output buffer circuit is larger than the output buffer circuit of the present invention as shown in FIG. 6B. Therefore, the TpLH, the TpHL, and noise reduction effects are inferior to the output buffer circuit of the present invention.

When the above result is taken into consideration, the output buffer of the present invention can obtain relatively short TpLH and TpHL and can reduce a noise.

Second Preferred Embodiments

Figure 7:
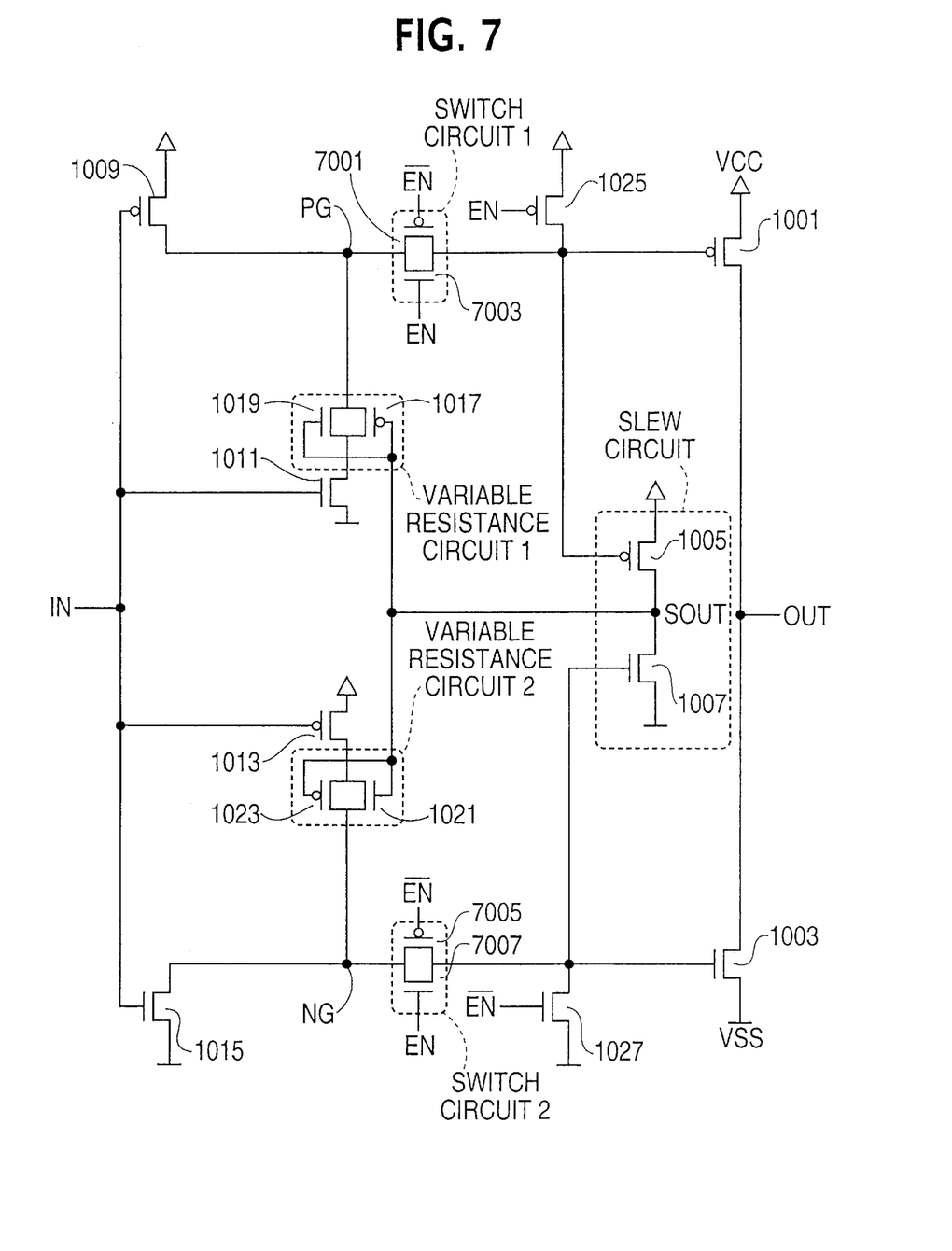
FIG. 7 is a circuit diagram showing an output buffer circuit according to a second preferred embodiment of the present invention.

FIG. 7 is a circuit diagram showing an output buffer circuit according to a second preferred embodiment of the present invention.

The difference between the second preferred embodiment and the first preferred embodiment resided in that a switch circuit SW1 and a switch circuit SW2 exist in the second preferred embodiment.

The switch circuit SW1 is connected between the node PG and the gate of the PMOS 1001. The switch circuit SW1 comprised the PMOS 7001 and the NMOS 7003 which are connected in parallel to each other. The PMOS 7001 has source/drain connected to the node PG, drain/source connected to the gate of the PMOS 1001, and a gate which receives the enable signal/EN. The NMOS 7003 has source/drain connected to the node PG, drain/source connected to the gate of PMOS 1001, and a gate which receives the enable signal EN.

The switch circuit SW2 is connected between the node NG and the gate of the NMOS 1003. The switch circuit SW2 comprises the PMOS 7005 and the NMOS 7007 which are connected in parallel to each other. The PMOS 7005 has source/drain connected to the node NG, drain/source connected to the gate of the NMOS 1003, and a gate which receives the enable signal/EN. The NMOS 7007 has source/drain connected to the node NG, drain/source connected to the gate of the NMOS 1003, and a gate which receives the enable signal EN.

Basic operation of the output buffer circuit shown in FIG. 7 is the same as that of operation of the output buffer circuit shown in FIG. 1. The difference between the operation of the first embodiment and the operation of the second embodiment is an operation for setting the data output node OUT to the high impedance state.

When the enable signal EN having L level is output from the enable signal generating circuit ENG, the PMOS 1025 and the NMOS 1027 enter into the ON states, and the PMOS 7001, the NMOS 7003, the PMOS7005, and the NMOS 7007 enter into the OFF state. That is, the switch circuit SW1 and the switch circuit SW2 enter into an OFF state. Since the switch circuit SW1 and the switch circuit SW2 are in the OFF states, the potential of the node PG and the potential of the node NG are not transferred to the gate of the PMOS 1001, and the gate of the NMOS 1003. Furthermore, since the PMOS 1025 and the NMOS 1027 are in the ON states, the pull up of the node PG to H level is carried out, and the pull down of node NG to L level is carried out. Thereby, the PMOS 1001 and the NMOS 1003 enter into the OFF states. Consequently, the data output node OUT enters into the high impedance state.

In normal operation, since the enable signal EN having H level is output from the enable signal generating circuit ENG, the switch circuit SW1 and the switch circuit SW2 in the ON states. Operation as explained above is performed by this.

As mentioned above, according to the second preferred embodiment, the first and the second CMOS inverters is not disable state during the data output node OUT is set at the high impedance state. Therefore, the time period in which the input data is transferred to the output node OUT can be shortened when the output buffer circuit returns to the normal operation.

Third Preferred Embodiment

Figure 8:
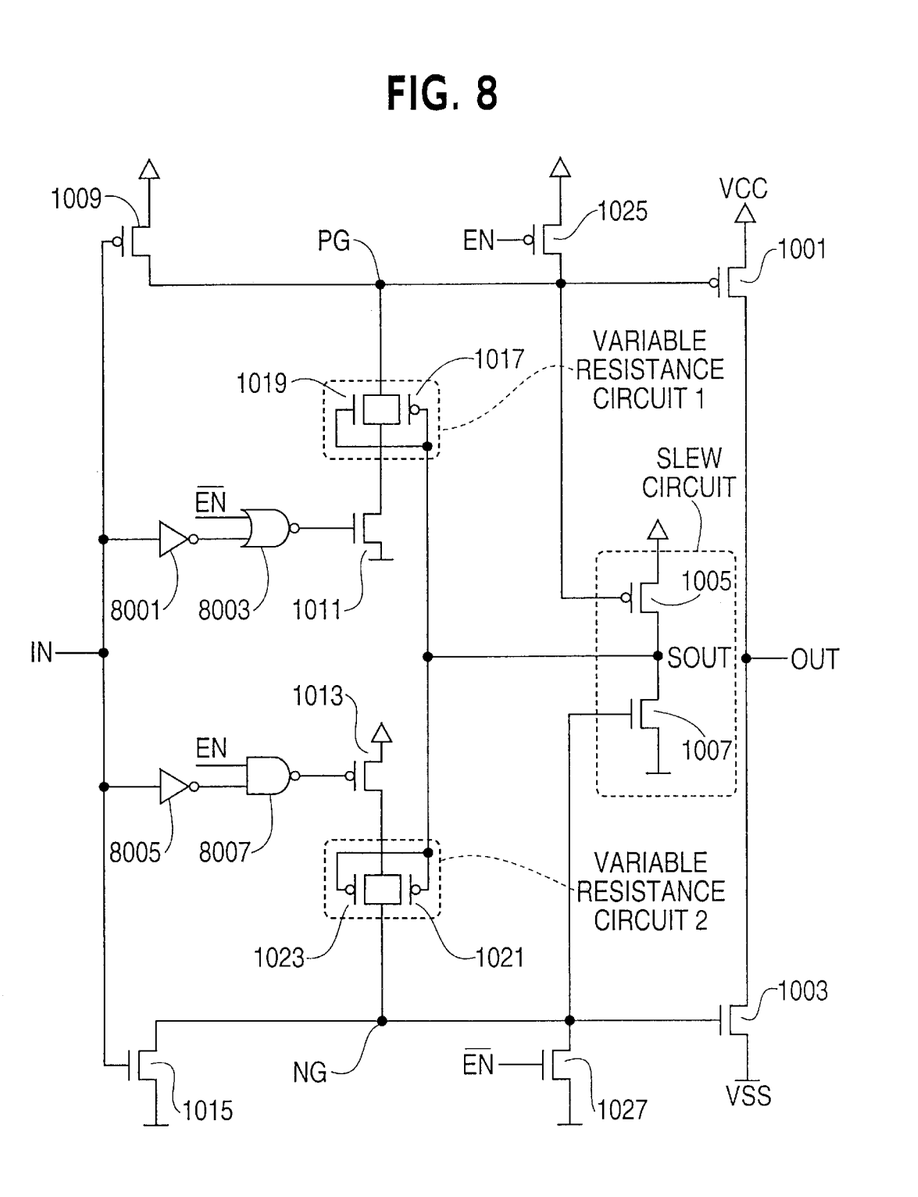
FIG. 8 is a circuit diagram showing an output buffer circuit according to a third preferred embodiment of the present invention.

FIG. 8 is a circuit diagram showing an output buffer circuit according to a third preferred embodiment of the present invention.

The difference between the third preferred embodiment and the first preferred embodiment resided in that an inverter 8001, an inverter 8005, a NOR circuit 8003, and a NAND circuit 8007 exist.

The inverter 8001 is connected between the data input node IN and the NOR circuit 8003. The NOR circuit 8003 is connected between the inverter 8001 and the NMOS 1011.

The inverter 8005 is connected between the data input node IN and the NAND circuit 8007. The NAND circuit 8007 is connected between the inverter 8005 and PMOS 1013.

Basic operation of the output buffer circuit shown in FIG. 8 is the same as that of operation of the output buffer circuit shown in FIG. 1. The difference between the operation of the first embodiment and the operation of the third embodiment is an operation for setting the data output node OUT to the high impedance state.

When the enable signal EN having L level is output from the enable signal generating circuit ENG, the PMOS 1025 and the NMOS 1027 enter into the ON state. Since the PMOS 1025 and the NMOS1027 are in the ON states, the pull-up of the node PG to H level is carried out, and the pull down of node NG to L level is carried out. Thereby, the PMOS 1001 and the NMOS 1003 enter into the OFF states. Consequently, the data output node OUT enters into the high impedance state.

Furthermore, when the enable signal EN having L level is output from the enable signal generating circuit ENG, the output of the NOR circuit 8003 is set to L level regardless of a signal output from the inverter 8001, and the output of the NAND circuit 8007 is set to H level regardless of a signal output from the inverter 8005. When the output of the NOR circuit 8003 is set to L level, the NMOS 1011 changes into the OFF state and thus first CMOS inverter enters into the disable state. When the output of the NAND circuit 8007 is set to H level, the PMOS 1013 changes into the OFF state and thus second CMOS inverter enters into the disable state. Therefore, the potential of the data input node IN is not transferred to the node PG and the node NG.

In normal operation, since the enable signal EN having H level is output from the enable signal generating circuit ENG, the output of the NOR circuit 8003 and the NAND circuit 8007 transfers the output of the inverter 8001 and the inverter 8005 to the NMOS 1011 and the PMOS 1013. Operation as explained previously is performed by this.

While the preferred form of the present invention has been described, it is to be understood that modifications will be apparent to those skilled in the art without departing from the spirit of the invention. The scope of the invention is to be determined solely by the following claims.

What is claimed is:

1. An output buffer circuit comprising:
   a power supply node supplied with a power supply potential level;
   a ground node supplied with a ground potential level;
   a data output node which outputs data;

a first transistor of a first conductive type, which is coupled between said power supply node and said data output node and which has a control electrode;

a second transistor of a second conductive type, which is coupled between said ground node and said data output node and which has a control electrode;

a data input node which received data;

a first pull up transistor of the first conductive type, which is provided at a first current path between said power supply node and the control electrode of said first transistor and which charges the control electrode of said first transistor to the power supply potential level in response to data at said data input node;

a first pull down transistor of the second conductive type, which is provided at a second current path between said ground node and the control electrode of said first transistor and which discharges the control electrode of said first transistor to the ground potential level in response to data at said data input node;

a second pull up transistor of the first conductive type, which is provided at a third current path between said power supply node and the control electrode of said second transistor and which charges the control electrode of said second transistor to the power supply potential level in response to data at said data input node;

a second pull down transistor of the second conductive type, which is provided at a fourth current path between said ground node and the control electrode of said second transistor and which discharges the control electrode of said second transistor to the ground potential level in response to data at said data input node;

a slew-rate control node;

a third transistor of the first conductive type, which is coupled between said power supply node and said slew-rate control node and which has a control electrode connected to the control electrode of said first transistor;

a fourth transistor of the second conductive type, which is coupled between said ground node and said slew-rate control node and which has a control electrode connected to the control electrode of said second transistor;

a first variable resistance circuit which is provided at the second current path and which has a resistance value, the resistance value of said first variable resistance circuit is changed in response to a potential of said slew-rate control node; and a second variable resistance circuit which is provided at the third current path and which has a resistance value, the resistance value of said second variable resistance circuit is changed in response to a potential of said slew-rate control node.

2. The output buffer circuit as set forth in claim 1, wherein said first variable resistance circuit includes a fifth transistor of the first conductive type and a sixth transistor of the second conductive type, each of which are connected in parallel to each other, wherein each of the fifth and the sixth transistors has a control electrode connected to the slew-rate control node, wherein said second variable resistance circuit includes a seventh transistor of the first conductive type and a eighth transistor of the second conductive type, each of which are connected in parallel to each other, and wherein each of the seventh and the eighth transistors has a control electrode connected to the slew-rate control node.

3. The output buffer circuit as set forth in claim 2, wherein the first and the third transistors are P channel type MOS transistors having a same threshold voltage, and wherein the second and the fourth transistors are N channel type MOS transistors having a same threshold voltage.

4. The output buffer circuit as set forth in claim 2, wherein the fifth and seventh transistors are P channel type MOS transistors, wherein the sixth and eighth transistors are N channel type MOS transistors, wherein an ON resistance of the fifth transistor is smaller than an ON resistance of the sixth transistor, and wherein an ON resistance of the eighth transistor is smaller than on ON resistance of the seventh transistor.

5. The output buffer circuit as set forth in claim 2, wherein the fifth, sixth, seventh and eighth transistors comprise unit cells.

6. The output buffer circuit as set forth in claim 5, wherein the unit cell comprises a MOS transistor.

7. The output buffer circuit as set forth in claim 1, further comprising:

a first resistance circuit coupled between said power supply node and said third transistor; and a second resistance circuit coupled between said ground node and said fourth transistor.

8. The output buffer circuit as set forth in claim 7, wherein said first and second resistance circuits include MOS transistors.

9. The output buffer circuit as set forth in claim 8, wherein said MOS transistors comprise unit cells.

10. The output buffer circuit as set forth in claim 1, further comprising:

a first switch circuit which is coupled between the control electrode of said first transistor and a first node, the first node being coupled between said first pull up transistor and said first variable resistance circuit, and which connects the control electrode of said first transistor to the first node in response to an enable signal; and a second switch circuit which is coupled between the control electrode of said second transistor and a second node, the second node being coupled between said second pull down transistor and said second variable resistance circuit, and which connects the control electrode of said second transistor to the second node in response to the enable signal.

11. The output buffer circuit as set forth in claim 1, further comprising:

a first logic circuit which is coupled between said data input node and the control electrode of said first pull down transistor, which inhibits an operation of said first pull down transistor in response to an enable signal; and a second logic circuit which is coupled between said data input node and the control electrode of said second pull up transistor, which inhibits an operation of said second pull up transistor in response to the enable signal.

12. An output buffer circuit comprising:

a power supply node supplied with a power supply potential level;

a ground node supplied with a ground potential level;

a data output node which outputs data;

a first MOS transistor of a first conductive type, which is coupled between said power supply node and said data output node and which has a gate electrode;

a second MOS transistor of a second conductive type, which is coupled between said ground node and said data output node and which has a gate electrode;

a data input node which receives data;

a third MOS transistor of the first conductive type, which is provided at a first current path between said power supply node and the gate electrode of said first MOS transistor and which connects the power supply node to the gate electrode of said first MOS transistor in response to data at said data input node;

a fourth MOS transistor of the second conductive type, which is provided at a second current path between said ground node and the gate electrode of said first MOS transistor and which connects the ground potential to the gate electrode of said first MOS transistor in response to data at said data input node;

a fifth MOS transistor of the first conductive type, which is provided at a third current path between said power supply node and the gate electrode of said second MOS transistor and which connects the power supply node to the gate electrode of said second MOS transistor in response to data at said data input node;

a sixth MOS transistor of the second conductive type, which is provided at a fourth current path between said ground node and the gate electrode of said second MOS transistor and which connects the ground node to the gate electrode of said second MOS transistor in response to data at said data input node;

a slew-rate control node;

a seventh MOS transistor of the first conductive type, which is coupled between said power supply node and said slew-rate control node and which has a gate electrode connected to the gate electrode of said first MOS transistor;

an eighth MOS transistor of the second conductive type, which is coupled between said ground node and said slew-rate control node and which has a gate electrode connected to the gate electrode of said second MOS transistor;

a first variable resistance circuit which is provided at the second current path and which has a resistance value, the resistance value of said first variable resistance circuit is changed in response to a potential of said slew-rate control node; and a second variable resistance circuit which is provided at the third current path and which has a resistance value, the resistance value of said second variable resistance circuit is changed in response to a potential of said slew-rate control node.

13. The output buffer circuit as set forth in claim 12, wherein said first variable resistance circuit includes a ninth transistor of the first conductive type and a tenth transistor of the second conductive type, each of which are connected in parallel to each other, wherein each of the ninth and the tenth transistors has a gate electrode connected to the slew-rate control node, wherein said second variable resistance circuit includes an eleventh transistor of the first conductive type and a twelfth transistor of the second conductive type, each of which are connected in parallel to each other, and wherein each of the eleventh and the twelfth transistors has a gate electrode connected to the slew-rate control node.

14. The output buffer circuit as set forth in claim 13, wherein the first and the seventh transistors are P channel type MOS transistors having a same threshold voltage, and wherein the second and the eighth transistors are N channel type MOS transistors having a same threshold voltage.

15. The output buffer circuit as set forth in claim 13, wherein the ninth and eleventh transistors are P channel type MOS transistors, wherein the tenth and twelfth transistors are N channel type MOS transistors, wherein an ON resistance of the ninth transistor is smaller than an ON resistance of the tenth transistor, and wherein an ON resistance of the twelfth transistor is smaller than an ON resistance of the eleventh transistor.

16. The output buffer circuit as set forth in claim 13, wherein the ninth, tenth, eleventh and twelfth transistors comprise unit cells.

17. The output buffer circuit as set forth in claim 12, further comprising:

a first resistance circuit coupled between said power supply node and said seventh MOS transistor; and a second resistance circuit coupled between said ground node and said eighth MOS transistor.

18. The output buffer circuit as set forth in claim 17, wherein said first and second resistance circuits include MOS transistors.

19. The output buffer circuit as set forth in claim 18, wherein said MOS transistors comprise unit cells.

20. The output buffer circuit as set forth in claim 12, further comprising:

a first switch circuit which is coupled between the gate electrode of said first MOS transistor and a first node, the first node being coupled between said third MOS transistor and said first variable resistance circuit, and which connects the gate electrode of said first MOS transistor to the first node in response to an enable signal; and a second switch circuit which is coupled between the gate electrode of said second MOS transistor and a second node, the second node being coupled between said sixth MOS transistor and said second variable resistance circuit, and which connects the gate electrode of said second MOS transistor to the second node in response to the enable signal.

21. The output buffer circuit as set forth in claim 12, further comprising:

a first logic circuit which is coupled between said data input node and the gate electrode of said fourth MOS transistor, which inhibits an operation of said fourth MOS transistor in response to an enable signal; and a second logic circuit which is coupled between said data input node and the gate electrode of said fifth MOS transistor, which inhibits an operation of said fifth MOS transistor in response to the enable signal.

* * * * *